United States Patent
Leng

(10) Patent No.: US 11,937,434 B2
(45) Date of Patent: Mar. 19, 2024

(54) FERROELECTRIC RANDOM ACCESS MEMORY (FRAM) CAPACITORS AND METHODS OF CONSTRUCTION

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/214,584

(22) Filed: Jun. 27, 2023

(65) Prior Publication Data

US 2023/0345735 A1 Oct. 26, 2023

Related U.S. Application Data

(62) Division of application No. 17/409,883, filed on Aug. 24, 2021, now Pat. No. 11,729,993.

(60) Provisional application No. 63/208,531, filed on Jun. 9, 2021.

(51) Int. Cl.
| | |
|---|---|
| *H01L 21/00* | (2006.01) |
| *H01L 49/02* | (2006.01) |
| *H10B 53/30* | (2023.01) |

(52) U.S. Cl.
CPC .............. *H10B 53/30* (2023.02); *H01L 28/55* (2013.01); *H01L 28/65* (2013.01); *H01L 28/92* (2013.01)

(58) Field of Classification Search
CPC ......... H10B 53/30; H01L 28/55; H01L 28/65; H01L 28/92
See application file for complete search history.

(56) References Cited

U.S. PATENT DOCUMENTS

| | | | |
|---|---|---|---|
| 5,949,092 A | 9/1999 | Kadosh et al. | 257/67 |
| 5,990,507 A | 11/1999 | Mochizuki et al. | 257/295 |
| 6,043,529 A | 3/2000 | Hartner et al. | 257/306 |
| 6,528,328 B1 | 3/2003 | Aggarwal et al. | 438/3 |
| 2004/0129961 A1 | 7/2004 | Paz De et al. | 257/295 |

(Continued)

OTHER PUBLICATIONS

Russell, M.W. et al., "Damascene Processing of Ferroelectric Capacitors," Proceedings of the 2000 12th IEEE International Symposium on Applications of Ferroelectrics, pp. 247-250, Jul. 21, 2000.

(Continued)

*Primary Examiner* — Richard A Booth
(74) *Attorney, Agent, or Firm* — SLAYDEN GRUBERT BEARD PLLC

(57) ABSTRACT

Ferroelectric random access memory (FRAM) capacitors and methods of forming FRAM capacitors are provided. An FRAM capacitor may be formed between adjacent metal interconnect layers or between a silicided active layer (e.g., including MOSFET devices) and a first metal interconnect layer. The FRAM capacitor may be formed by a damascene process including forming a tub opening in a dielectric region, forming a cup-shaped bottom electrode, forming a cup-shaped ferroelectric element in an interior opening defined by the cup-shaped bottom electrode, and forming a top electrode in an interior opening defined by the cup-shaped ferroelectric element. The FRAM capacitor may form a component of an FRAM memory cell. For example, an FRAM memory cell may include one FRAM capacitor and one transistor (1T1C configuration) or two FRAM capacitors and two transistor (2T2C configuration).

20 Claims, 13 Drawing Sheets

(56) References Cited

U.S. PATENT DOCUMENTS

2020/0235110 A1 7/2020 Morris et al.
2022/0328508 A1 10/2022 Lin et al.

OTHER PUBLICATIONS

Clarke, Peter, "TI Pushes Ferroelectric RAM Forward in Memory Race," EE Times, URL: https://www.eetimes.com/ti-pushes-ferroelectric-ram-forward-in-memory-race/, 2 pages, Jul. 11, 2002.
Nishi, Yoshio, "Advances in Non-volatile Memory and Storage Technology," Book, Woodhead Publishing, $1^{st}$ Edition, 1 page description, Jun. 26, 2014.
International Search Report and Written Opinion, Application No. PCT/US2021/062520, 12 pages, dated Apr. 5, 2022.

FERROELECTRIC RANDOM ACCESS MEMORY (FRAM) CAPACITORS AND METHODS OF CONSTRUCTION

RELATED APPLICATIONS

This application is a divisional of U.S. application Ser. No. 17/409,883 filed Aug. 24, 2021, which claims priority to commonly owned U.S. Provisional Patent Application No. 63/208,531 filed Jun. 9, 2021, the entire contents of which applications are hereby incorporated by reference for all purposes.

TECHNICAL FIELD

The present disclosure relates to non-volatile memory (NVM), and more particularly to ferroelectric random access memory (FRAM) capacitors and methods of construction, and FRAM memory cells including FRAM capacitors.

BACKGROUND

Non-volatile memory (NVM) refers to memory that can retain data without an external power supply. NVM is useful for many applications, for example as a microcontroller component. In contrast, static random access memory (SRAM), typically composed of six transistors, needs external power to retain data. Similarly, dynamic random access memory (DRAM), typically including one transistor and one capacitor, also needs external power to retain and refresh data.

Currently, the most common form of NVM is flash memory, which comprises floating-gate based memory cells. NOR type flash memory is typically used for storing code, while NAND type flash memory is typically used for storing data. However, flash memory has various limitations and drawbacks. For example, it is difficult to continue to reduce the critical dimensions of flash memory. In addition, flash memory often requires high voltage (typically about 20V) for programming and erasing. Further, addition of flash memory cells to the typical CMOS process flow as embedded memory requires several additional photomask layers, for example, 5 or more mask layers. This significantly increases the cost of flash memory in embedded applications.

Thus, other types of NVM memory have been developed in recent years, including ferroelectric random access memory (FRAM). An FRAM memory cell includes at least one transistor and at least one capacitor ("FRAM capacitor"). Typical FRAM memory cells are constructed with a 1T1C (one transistor, one capacitor) architecture including a transistor (e.g., a metal-oxide-semiconductor field-effect transistor, or MOSFET) and an FRAM capacitor, or a 2T2C (two transistor, two capacitor) architecture including two transistors (e.g., MOSFETs) and two FRAM capacitors.

An FRAM capacitor includes a ferroelectric element sandwiched between two electrodes, thus defining a capacitor having an electrode-ferroelectric element-electrode structure, referred to herein as an EFE structure. The ferroelectric element contains a crystal that can spontaneously polarize to one of two defined two states by an external electric field, and can be polarized to the other of the two defined states by a reverse external electric field. The polarization state is maintained after the removal of external electric field (i.e., defining non-volatile data storage). Change of the polarization state does not involve atomic collision; as a result FRAM memory cells typically exhibit high read and write speeds, ultra-low power consumption, and almost unlimited write cycles. Thus, FRAM memory is particularly suitable for storage memory in certain systems, for example for frequent reading and writing of data between different sub systems.

In addition, FRAM has unique advantages for microcontroller (MCU) applications. For example, as compared with flash memory, FRAM typically requires no high voltage devices, uses significantly less power, may provide faster write performance, and may provide greater maximum read/write endurance.

However, typical FRAM capacitors have various drawbacks or disadvantages. For example, some FRAM capacitor constructions requires at least two added mask layers, as compared with the relevant background integrated circuit fabrication process. Also, some FRAM capacitors are formed as stacked capacitors, which are typically difficult to etch. For example, conventional reactive ion etching (RIE) may not be suitable because noble metals, which are often used for both the top and bottom electrodes of the FRAM capacitor, are not reactive and the vapor pressures of by-products from ferroelectric materials are extremely low. Therefore, physically-assisted RIE may need to be employed by using argon-mixed etching gases, which often causes significant challenges for etch chamber maintenance. Also, FRAM capacitors may bear the risk of hydrogen exposure, as hydrogen reacts with ferroelectric materials, which may cause a permanent reduction in their polarization capability.

There is a need to build FRAM capacitors that reduce or eliminate any one or more of the drawbacks and challenges discussed above. There is a need to build FRAM capacitors at lower cost (e.g., by reducing or eliminating added mask layers) and with improved manufacturing process (e.g., by eliminating the exotic electrode metal etch mentioned above).

SUMMARY

The present disclosure provides FRAM capacitors and methods of construction, and FRAM memory cells including FRAM capacitors. As used herein, an FRAM capacitor refers to a capacitor formed with a ferroelectric element. An FRAM capacitor may include an electrode-ferroelectric element-electrode or "EFE" structure formed between adjacent metal interconnect layers or between an active layer (e.g., including MOSFET devices) and a first metal interconnect layer. The EFE structure of the FRAM capacitor may be formed by a damascene process including forming a tub opening in a dielectric region, forming a cup-shaped bottom electrode in the tub opening, forming a cup-shaped ferroelectric element in an interior opening defined by the cup-shaped bottom electrode, and forming a top electrode in an interior opening defined by the cup-shaped ferroelectric element. In some embodiments, the cup-shaped bottom electrode may be formed concurrently with at least one interconnect via, e.g., by deposition of tungsten or other conformal metal into respective openings formed in a dielectric region. In some examples, the FRAM capacitor may be formed without adding any photomask processes to a background integrated circuit fabrication process, e.g., a typical CMOS fabrication process.

One aspect provides a method of forming an integrated circuit structure including an FRAM capacitor. The method includes forming a tub opening in a dielectric region, forming a cup-shaped bottom electrode in the tub opening, forming a cup-shaped ferroelectric element in an interior opening defined by the cup-shaped bottom electrode, forming a top electrode in an interior opening defined by the cup-shaped ferroelectric element, and forming an upper metal layer over the dielectric region, the upper metal layer including a capacitor contact in conductive contact with the top electrode. The cup-shaped bottom electrode, cup-shaped ferroelectric element, and top electrode define the FRAM capacitor.

In some examples, the FRAM capacitor is formed by a damascene process. The FRAM capacitor may be formed without adding any photomask processes to a background integrated circuit fabrication process.

In one example, the method includes forming a cup-shaped bottom electrode contact in the tub opening, and forming the cup-shaped bottom electrode in an interior opening defined by the cup-shaped bottom electrode contact. In one example, the method includes depositing a conformal metal to concurrently form (a) the cup-shaped bottom electrode contact in the tub opening and (b) a via in a via opening spaced apart from the tub opening in the dielectric region. In one example, forming the upper metal layer over the dielectric region comprises concurrently forming the capacitor contact in contact with the top electrode and an upper interconnect element in contact with the via.

In one example, prior to forming the upper metal layer over the dielectric region, a top surface of the cup-shaped ferroelectric element is planarized with a top surface of the dielectric region, and a diffusion barrier layer is deposited to cover the planarized top surface of the cup-shaped ferroelectric element.

In one example, prior to forming the upper metal layer over the dielectric region, a top surface of the cup-shaped bottom electrode, a top surface of the cup-shaped ferroelectric element, and a top surface of the top electrode are planarized, and a diffusion barrier layer is deposited to cover the planarized top surfaces of the cup-shaped bottom electrode, the cup-shaped ferroelectric element, and the top electrode.

In one example, the top electrode is cup-shaped, and the method includes forming a top electrode contact in an interior volume defined by the cup-shaped top electrode, and the capacitor contact is formed in conductive contact with the top electrode contact.

In some examples, each of the bottom electrode and the top electrode comprises at least one noble metal. For example, each of the bottom electrode and the top electrode may comprise iridium or platinum. In one example, each of the bottom electrode and the top electrode comprises iridium and iridium oxide.

In one example, the ferroelectric element comprises lead zirconate titanate (PZT). In other examples, the ferroelectric element comprises strontium bismuth niobate tantalate (SBNT), strontium-bismuth-tantalate (SBT), or lanthanum-substituted bismuth-titanate (BLT).

Another aspect provides an integrated circuit structure including a dielectric region including a tub opening, an FRAM capacitor formed in the tub opening, and an upper metal layer formed over the FRAM capacitor. The FRAM capacitor includes a cup-shaped bottom electrode, a cup-shaped ferroelectric element, and a top electrode. The upper metal layer formed over the dielectric region may include a capacitor contact in conductive contact with the top electrode of the FRAM capacitor.

In one example, the dielectric region is formed over a lower metal interconnect layer, and the upper metal layer comprises an upper metal interconnect layer.

In one example, the dielectric region is formed over a transistor including a doped source region and a doped drain region, and the cup-shaped bottom electrode is conductively coupled to the doped source region or the doped drain region of the transistor.

In some examples, the integrated circuit structure includes a cup-shaped bottom electrode contact formed on a silicide region on a top side of the doped source region or doped drain region of the transistor, wherein the cup-shaped bottom electrode is formed on the cup-shaped bottom electrode contact. In one example, the upper metal layer comprises a metal-1 interconnect layer.

In one example, the top electrode is cup-shaped, the integrated circuit structure includes a top electrode contact at least partially formed in an interior volume defined by the cup-shaped top electrode, and the capacitor contact conductively contacts the top electrode contact so as to be in conductive contact with the top electrode.

In one example, the integrated circuit structure includes a via formed in a via opening laterally spaced apart from the tub opening in the dielectric region, and the upper metal layer includes an interconnect element in contact with the via.

Another aspect provides a ferroelectric random access memory (FRAM) memory cell including (a) a transistor including a gate, a doped source region and a doped drain region; and (b) an FRAM capacitor coupled to the transistor and including a cup-shaped bottom electrode, a cup-shaped ferroelectric element formed in an interior opening defined by the cup-shaped bottom electrode, and a top electrode formed in an interior opening defined by the cup-shaped ferroelectric element.

In one example, the FRAM capacitor includes a cup-shaped bottom electrode contact formed on a silicide region on a top side of the doped source region or doped drain region of the transistor, and the cup-shaped bottom electrode is formed in an interior volume defined by the cup-shaped bottom electrode contact.

In one example, the FRAM capacitor includes a cup-shaped bottom electrode contact formed on a lower interconnect element of a metal interconnect layer, and the cup-shaped bottom electrode is formed in an interior volume defined by the cup-shaped bottom electrode contact.

In one example, the FRAM capacitor is formed in a common via layer with at least one interconnect via or contact via.

In one example, the FRAM memory cell has a one-transistor-one-capacitor (1T1C) configuration. In another example, the FRAM memory cell has a two-transistor-two-capacitor (2T2C) configuration including the transistor, an additional transistor, the FRAM capacitor, and an addition FRAM capacitor.

BRIEF DESCRIPTION OF THE DRAWINGS

Example aspects of the present disclosure are described below in conjunction with the figures, in which.

Figure 1A:
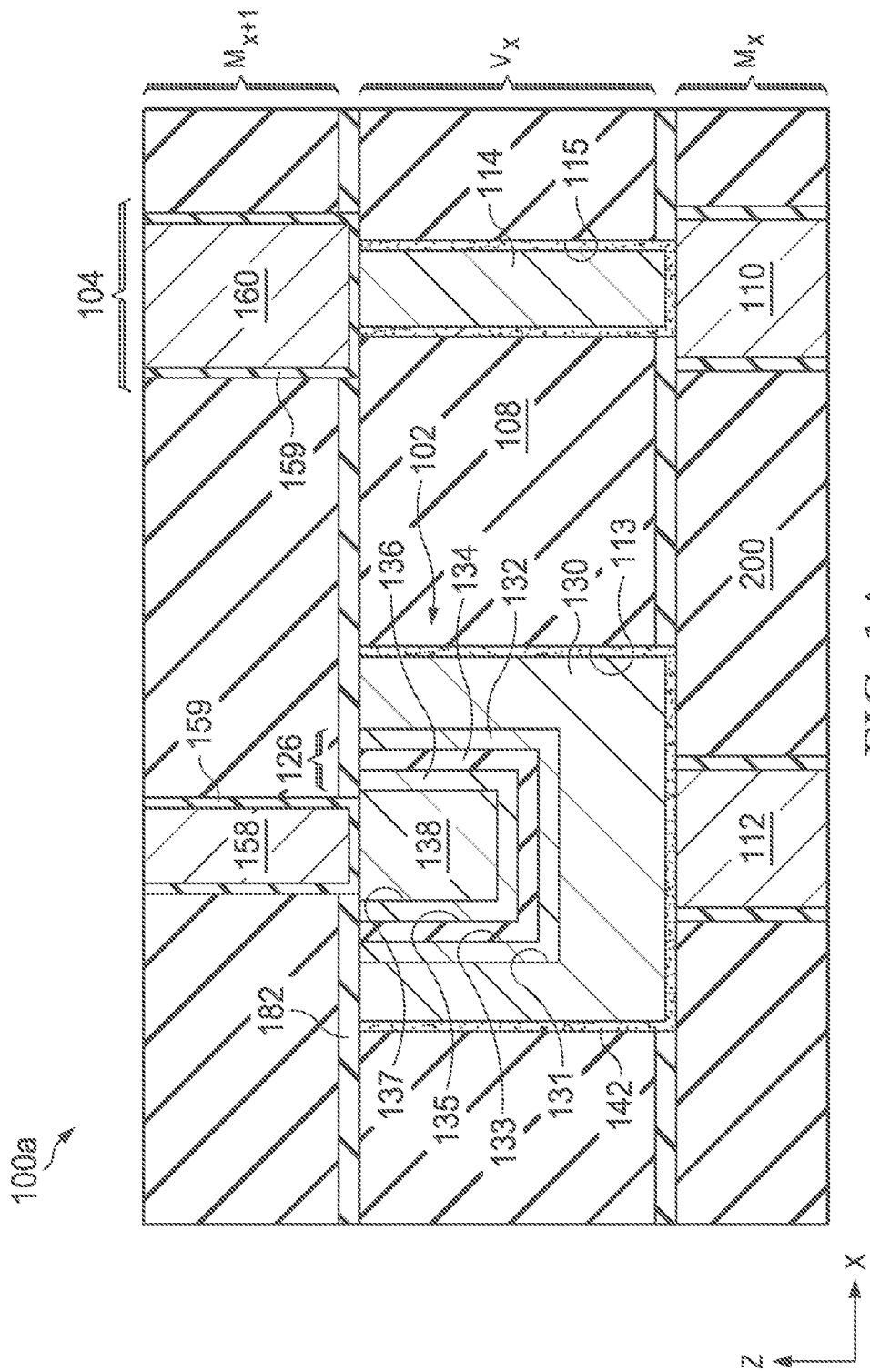
FIG. 1A shows an example integrated circuit structure including an example FRAM capacitor and an example interconnect structure formed between two metal interconnect layers.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides Ferroelectric Random Access Memory (FRAM) capacitors and methods of construction, and FRAM memory cells including FRAM capacitors. An FRAM capacitor may include a cup-shaped "electrode-ferroelectric element-electrode" or "EFE" structure formed between two metal layers, e.g., a lower metal layer $M_x$ and an upper metal layer $M_{x+1}$. Such FRAM capacitors may be formed in accordance with the present disclosure without any added mask layers, as compared with a background CMOS fabrication process.

As used herein, a "metal layer," for example in the context of the lower metal layer $M_x$ and upper metal layer $M_{x+1}$, may comprise any metal or metalized layer or layers, including:

(a) a metal interconnect layer, e.g., comprising copper, aluminum or other metal formed by a damascene process or deposited by a subtractive patterning process (e.g., deposition, patterning, and etching of a metal layer), or (b) a silicided active region including a number of silicided structures (structures having a metal silicide layer formed thereon), for example a silicided source region, drain region, or polysilicon gate of a MOSFET.

For example, an FRAM capacitor may be constructed between two adjacent metal interconnect layers $M_x$ and $M_{x+1}$ at any depth in an integrated circuit structure. As another example, an FRAM capacitor may be constructed over a silicided active region, in particular on a silicon transistor having metal silicide layers formed on selected transistor components, and below a first metal interconnect layer (often referred to as Metal-1); in such an example, the silicided active region defines the lower metal layer $M_x$ where x=0 (i.e., $M_0$) and the first metal interconnect layer (Metal-1) defines the upper metal layer $M_{x+1}$ (i.e., $M_1$).

In some examples, at least one component of the FRAM capacitor may be formed concurrently with certain interconnect structures, e.g., interconnect via, separate from the FRAM capacitor. For example, a cup-shaped bottom electrode contact of the FRAM capacitor may be formed concurrently with interconnect vias, by deposition of a conformal metal layer, e.g., tungsten or cobalt, into respective openings for the cup-shaped bottom electrode and interconnect vias. For example, FIGS. 1A, 2A-2I, and 3 show example FRAM capacitors formed concurrently with an interconnect via.

In other examples, the FRAM capacitor may be formed distinctly (i.e. non-concurrently) from interconnect structures, e.g., interconnect vias. For example, FIG. 1B shows an FRAM capacitor formed distinctly (non-concurrently) from interconnect vias. The example FRAM capacitor shown in FIG. 3 may similarly be formed distinctly (non-concurrently) from interconnect structures, e.g., interconnect vias.

As discussed below with reference to FIGS. 2A-2I, in some examples the FRAM capacitor may be constructed without adding any mask operations to the background integrated circuit fabrication process. The FRAM capacitor may be built using a damascene process, which may avoid plasma etching problems associated with some conventional FRAM capacitor fabrication processes. In some examples, the FRAM capacitor may be enclosed by a hydrogen diffusion barrier, e.g., to protect the ferroelectric material against degradation from hydrogen exposure.

Figure 1B:
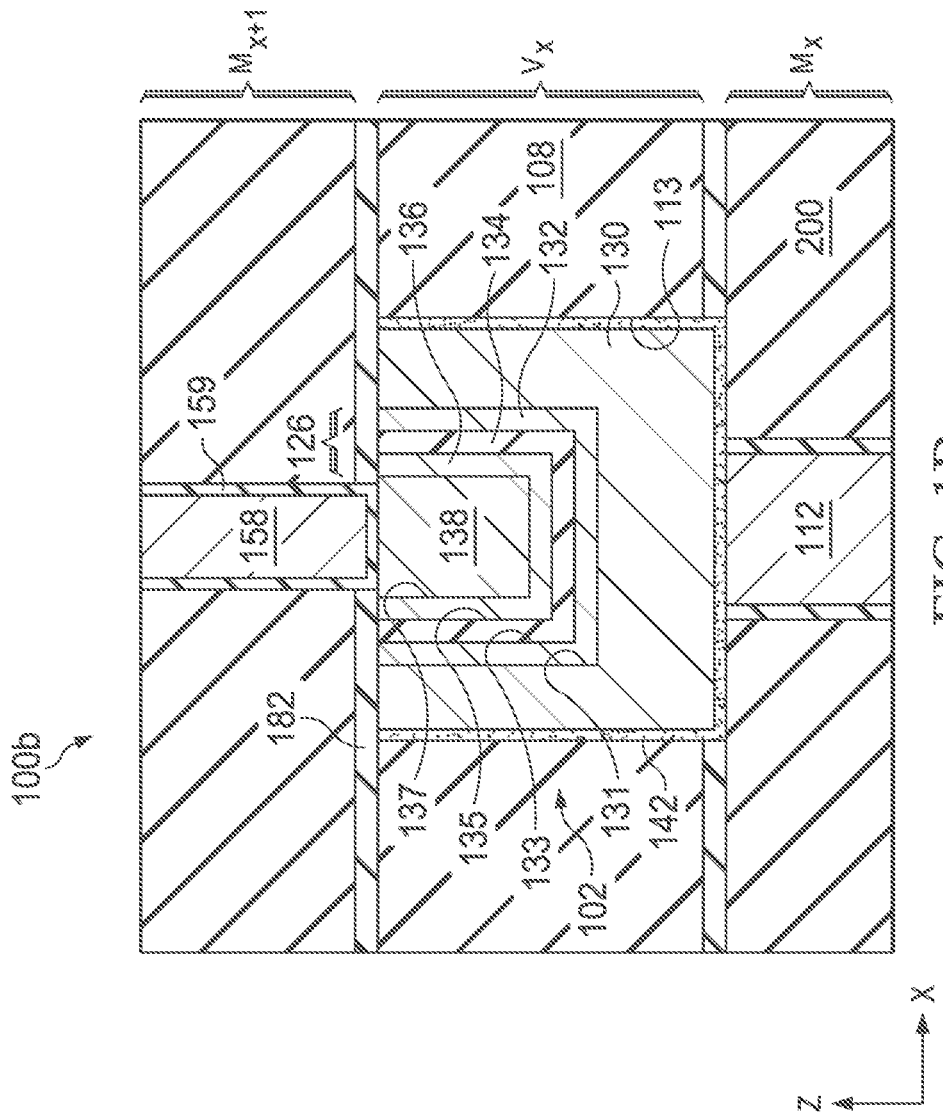
FIG. 1B shows an example integrated circuit structure including an example FRAM capacitor formed between two metal interconnect layers.

FIG. 1A shows an example integrated circuit structure 100a including an example FRAM capacitor 102 and an interconnect structure 104. The FRAM capacitor 102 is formed between a lower metal layer $M_x$ and an upper layer $M_{x+1}$. In the example shown in FIG. 1A (and FIGS. 2A-2I) the lower metal layer $M_x$ and an upper layer $M_{x+1}$ are two adjacent metal interconnect layers, such that the FRAM capacitor 102 is formed in a via layer $V_x$ between the two adjacent metal interconnect layers $M_x$ and $M_{x+1}$. In other examples, e.g., as shown in FIG. 3 discussed below, the FRAM capacitor 102 is formed in a via layer $V_0$ (typically called a contact layer) between a silicided active region (including one or more silicon-based transistors including silicided structures) $M_0$ and a metal interconnect layer $M_1$ (often referred to as Metal-1). Via layer $V_x$ may comprise various conductive structures formed in an inter-metal dielectric (IMD) region 108, e.g., an oxide region.

As shown in FIG. 1A, the interconnect structure 104 may include a lower interconnect element 110 formed in a lower metal layer $M_x$ (for example, where x=0 for a silicided active layer as discussed above) and an upper interconnect element 160 formed in an upper metal layer $M_{x+1}$, e.g., metal-1 layer, and connected to the lower interconnect element 110 by at least one interconnect via 114 formed in via layer $V_x$ by depositing a conformal metal, e.g., tungsten or cobalt, into respective via openings 115. Each of the lower interconnect element 110 and upper interconnect element 160 may comprise a wire or other laterally elongated structure (e.g., elongated in the y-axis direction), or a discrete pad (e.g., having a square, circular, or substantially square or circular shape in the x-y plane), or any other suitable shape and structure.

The FRAM capacitor 102 includes a three-dimensional (3D) electrode-ferroelectric element-electrode (EFE) structure 126 formed in a tub opening 113 in the via layer $V_x$. The 3D EFE structure 126 includes (a) a cup-shaped bottom electrode 132 formed in an interior opening 131 defined by a cup-shaped bottom electrode contact 130, (b) a cup-shaped ferroelectric element 134 formed in an interior opening 133 defined by the cup-shaped bottom electrode 132, and (c) a top electrode 136 formed in an interior opening 135 defined by the cup-shaped ferroelectric element 134. Cup-shaped bottom electrode contact 130 is in contact with a lower interconnect element 112 formed in lower metal layer $M_x$. Lower interconnect element 112 may comprise a wire or other laterally elongated structure (e.g., elongated in the y-axis direction), or a discrete pad (e.g., having a square, circular, or substantially square or circular shape in the x-y plane), or any other suitable shape and structure.

In some examples, the FRAM capacitor 102 includes the cup-shaped bottom electrode contact 130, which cup-shaped bottom electrode contact 130 is formed in the tub opening 113 prior to the cup-shaped bottom electrode 132. Further, in some examples, the top electrode 136 is formed as a cup-shaped top electrode 136, and the FRAM capacitor 102 includes a top electrode contact 138 formed in an interior opening 137 defined by the cup-shaped top electrode 136.

Each of the cup-shaped bottom electrode contact 130, the cup-shaped bottom electrode 132, the cup-shaped ferroelectric element 134, and the cup-shaped top electrode 136 includes a respective laterally-extending base and multiple vertically-extending sidewalls extending upwardly from the laterally-extending base (e.g., four vertically-extending sidewalls extending upwardly from the respective laterally-extending base to define a cup-shaped structure). In some examples, the respective laterally-extending base of each cup-shaped component 130, 132, 134, 136 may have a rectangular perimeter (e.g., having a square or non-square rectangular shape) defining four lateral sides when viewed from above, with four vertically-extending sidewalls extending upwardly from the perimeter of the respective laterally-extending base. Due to the cup-shaped structure of the components of FRAM capacitor 102, the cup-shaped bottom electrode 132 may also be referred to as the outer electrode, and the top electrode 136 may also be referred to as the inner electrode.

As discussed below with reference to FIGS. 2A and 2B, the cup-shaped bottom electrode contact 130 may be formed concurrently with the interconnect via 114 by depositing the conformal metal, e.g., tungsten or cobalt, into the tub opening 113 and via opening 115 in via layer $V_x$. In some example, a glue layer 142, e.g., comprising titanium nitride (TiN), is deposited in the tub opening 113 and via opening 115 prior to the conformal metal, to improve adhesion between the conformal metal and IMD region 108.

In some examples, each of the cup-shaped bottom electrode 132 and top electrode 136 may be formed from a noble metal. For instance, the cup-shaped bottom electrode 132 and top electrode 136 may each comprise iridium or platinum. In one example, the cup-shaped bottom electrode 132 and top electrode 136 each comprise a mixture of iridium and iridium oxide.

In one example, the cup-shaped ferroelectric element 134 comprises lead zirconate titanate (PZT). In other examples, the cup-shaped ferroelectric element 134 comprises strontium bismuth niobate tantalate (SBNT), strontium-bismuth-tantalate (SBT), or lanthanum-substituted bismuth-titanate (BLT), without limitation.

The top electrode contact 138 may comprise titanium nitride (TiN), tungsten (W), or a combination thereof. In other examples, the top electrode contact 138 may comprise aluminum (Al), titanium (Ti), titanium tungsten (TiW), cobalt (Co), tantalum (Ta), tantalum nitride (TaN), copper (Cu), or any combination thereof.

A diffusion barrier layer 182, which may comprise a dielectric material, such as silicon nitride (SiN), silicon carbide (SiC), or aluminum oxide ($Al_2O_3$), without limitation, may be formed over the FRAM capacitor 102. The diffusion barrier layer 182 may acts as a hydrogen diffusion barrier to protect the cup-shaped ferroelectric element 134 against degradation from hydrogen exposure. In addition, the diffusion barrier layer 182 may act as an etch stop during construction of the upper metal layer $M_{x+1}$, e.g., during a damascene etch for creating metal elements in upper metal layer $M_{x+1}$.

The upper metal layer ($M_{x+1}$) formed over the via layer $V_x$ (which via layer $V_x$ including interconnect via 114 and 3D EFE structure 126) includes a capacitor contact 158 in electrical contact with the top electrode 136 (through the top electrode contact 138) and an upper interconnect element 160 in electrical contact with the interconnect via 114 and therefore in electrical contact with lower interconnect element 110. In some embodiments, the capacitor contact 158 and upper interconnect element 160 comprise damascene elements formed by a damascene process, e.g., using copper, tungsten, aluminum, or cobalt. For example, capacitor contact 158 and upper interconnect element 160 may comprise copper damascene elements formed over a barrier layer 159, e.g., a TaN/Ta bilayer.

Each of the capacitor contact 158 and upper interconnect element 160 may comprise a wire or other laterally elongated structure (e.g., elongated in the y-axis direction), or a discrete pad (e.g., having a square, circular, or substantially square or circular shape in the x-y plane), or any other suitable shape and structure.

Thus, according to the example process described above, the 3D EFE structure 126 may be formed in a common via layer $V_x$ concurrently with the interconnect via 114. In some embodiments, the cup-shaped bottom electrode contact 130 may be formed concurrently with via 114, e.g., by a conformal tungsten fill.

FIG. 1B shows an example integrated circuit structure 100b including an example FRAM capacitor 102, wherein the 3D EFE structure 126 is formed distinctly (non-concurrently) from interconnect vias. The example FRAM capacitor 102 shown in FIG. 3 may similarly be formed distinctly (non-concurrently) from interconnect structures, e.g., interconnect vias.

Figure 2A:
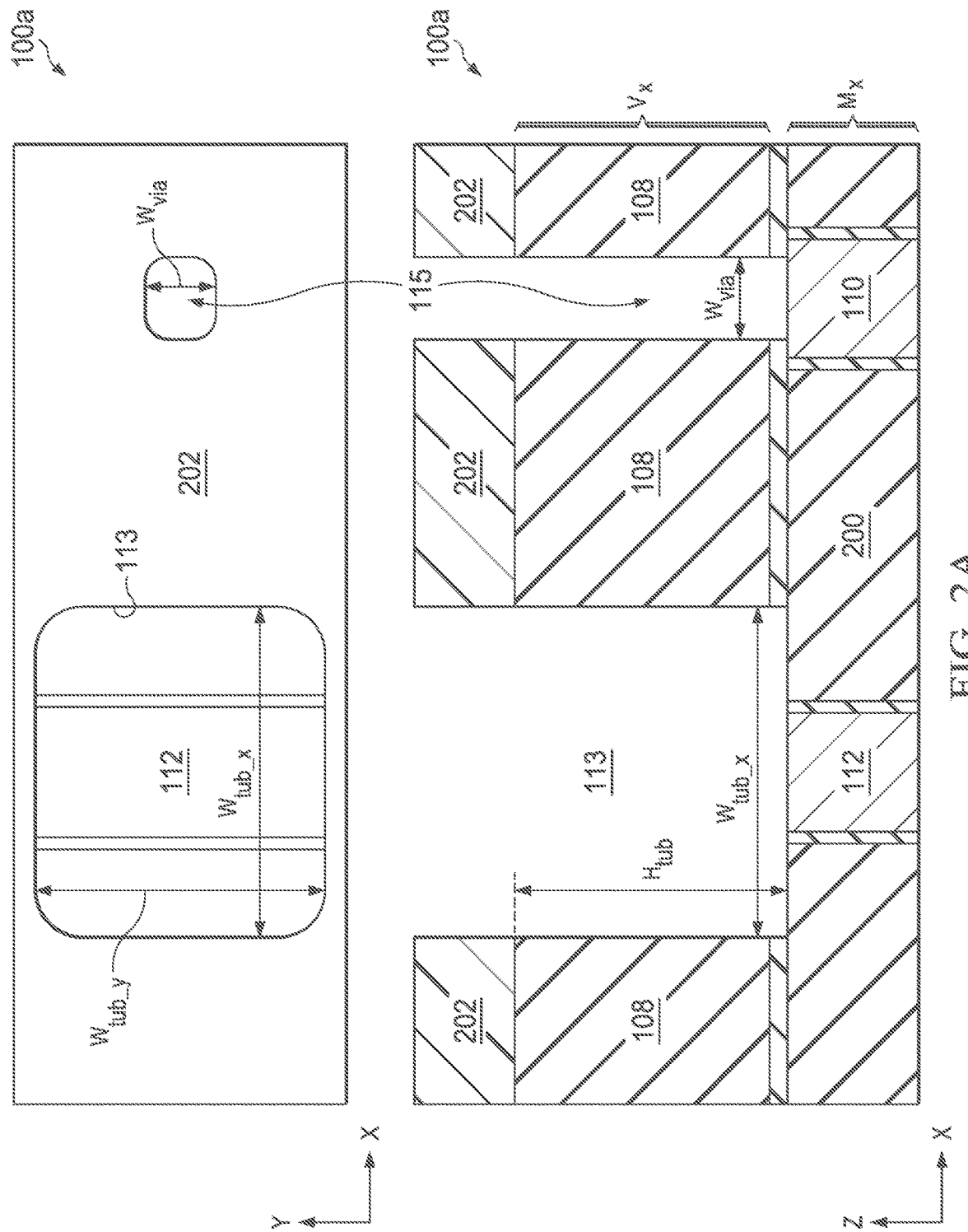
FIGS. 2A-2I illustrate an example process for forming the integrated circuit structure shown in FIG. 1A, including the example FRAM capacitor and an example interconnect structure.

FIGS. 2A-2I illustrate an example process for forming the integrated circuit structure 100a shown in FIG. 1A, including the example FRAM capacitor 102 and example interconnect structure 104 shown in FIG. 1A. Those skilled in the art will recognize that the same process, without reference to interconnect structure 104, can be used to form the integrated circuit structure 100b shown in FIG. 1B. First, as shown in FIG. 2A, which includes a top view (x-y plane) and a side cross-sectional via (x-z plane) of the integrated circuit structure 100a being formed, an inter-metal dielectric (IMD) region 108, e.g., comprising an oxide, is formed over a lower metal layer $M_x$ including lower interconnect elements 110 and 112 formed in a dielectric region 200. Lower interconnect elements 110 and 112 may comprise copper elements formed by a damascene process. Each lower interconnect element 110 and 112 of lower metal layer $M_x$ may comprise a wire or other laterally elongated structure (e.g., elongated in the y-axis direction), or a discrete pad (e.g., having a square, circular, or substantially square or circular shape in the x-y plane), or any other suitable shape and structure.

A photoresist layer 202 may be deposited and patterned to form photoresist openings, and the underlying IMD region 108 etched through the photoresist openings to form a tub opening 113 for the formation of 3D EFE structure 126 and one or more via openings 115 in the IMD region 108. One via opening 115 is shown in FIG. 2A. Via openings 115 may each have a square, circular, or other suitable shape from a top view (x-y plane), with a width (or diameter or critical dimension (CD)) $W_{via}$ in both the x-direction and y-direction in the range of 0.1-0.35 μm, or for example.

In contrast, the tub opening 113 may have a substantially greater width $W_{tub\_x}$ in the x-direction and width $W_{tub\_y}$ in the y-direction than via opening 115. The shape and dimensions of the tub opening 113 may be selected based on various parameters, e.g., for effective manufacturing of the 3D EFE structure 126 and/or for desired performance characteristics of the resulting FRAM capacitor 102. In one example, the tub opening 113 may have a square or rectangular shape in the x-y plane. In other examples, tub opening 113 may have a circular or oval shape in the x-y plane.

The width of tub opening 113 in the x-direction ($W_{tub\_x}$), y-direction ($W_{tub\_y}$), or both the x-direction and y-direction ($W_{tub\_x}$ and $W_{tub\_y}$) may be substantially larger than both the width $W_{Via}$ of via openings 115 in the x-direction and width $W_{Via}$ of via openings 115 in the y-direction. For example, in some examples, each width of $W_{tub\_x}$ and $W_{tub\_y}$ of tub opening 113 is at least twice as large as the width $W_{Via}$ of via openings 115. In particular examples, each width $W_{tub\_x}$ and $W_{tub\_y}$ of tub opening 113 is at least five time as large as the width $W_{Via}$ of via opening 215. Each width of tub opening 113 ($W_{tub\_x}$ and $W_{tub\_y}$) may be sufficient to allow a construction of the FRAM capacitor 102 within the tub opening 113 by a damascene process, for example allowing the construction of (a) the cup-shaped bottom electrode contact 130, (b) the cup-shaped bottom electrode 132 formed in interior opening 131 of the cup-shaped bottom electrode contact 130, (c) the cup-shaped ferroelectric element 134 formed in interior opening 133 of the cup-shaped bottom electrode 132, (d) the top electrode 136 formed in interior opening 135 of the cup-shaped ferroelectric element 134, and (e) the top electrode contact 138 formed in interior opening 137 of the top electrode 136. In some examples, $W_{tub\_x}$ and $W_{tub\_y}$ are each in the range of 0.5-100 μm, for example in the range of 0.5-10 μm.

Further, tub opening 113 may be formed with a height-to-width aspect ratio of less than or equal to 2.0 in both the x-direction and y-direction, e.g., to allow effective filling of the tub opening 113 by conformal materials. For example, tub opening 113 may be formed with aspect ratios $H_{tub}/W_{tub\_x}$ and $H_{tub}/W_{tub\_y}$ each in the range of 0.1-2.0, for example in the range of 0.5-2.0. In some examples, aspect ratios $H_{tub}/W_{tub\_x}$ and $H_{tub}/W_{tub\_y}$ are each less than or equal to 1.5, e.g., for effective filling of tub opening 113 by conformal materials, e.g., tungsten, cobalt, or aluminum. For example, tub opening 113 may be formed with aspect ratios $H_{tub}/W_{tub\_x}$ and $H_{tub}/W_{tub\_y}$ each in the range of 0.5-1.5, or more particularly in the range of 0.8-1.2.

Figure 2B:
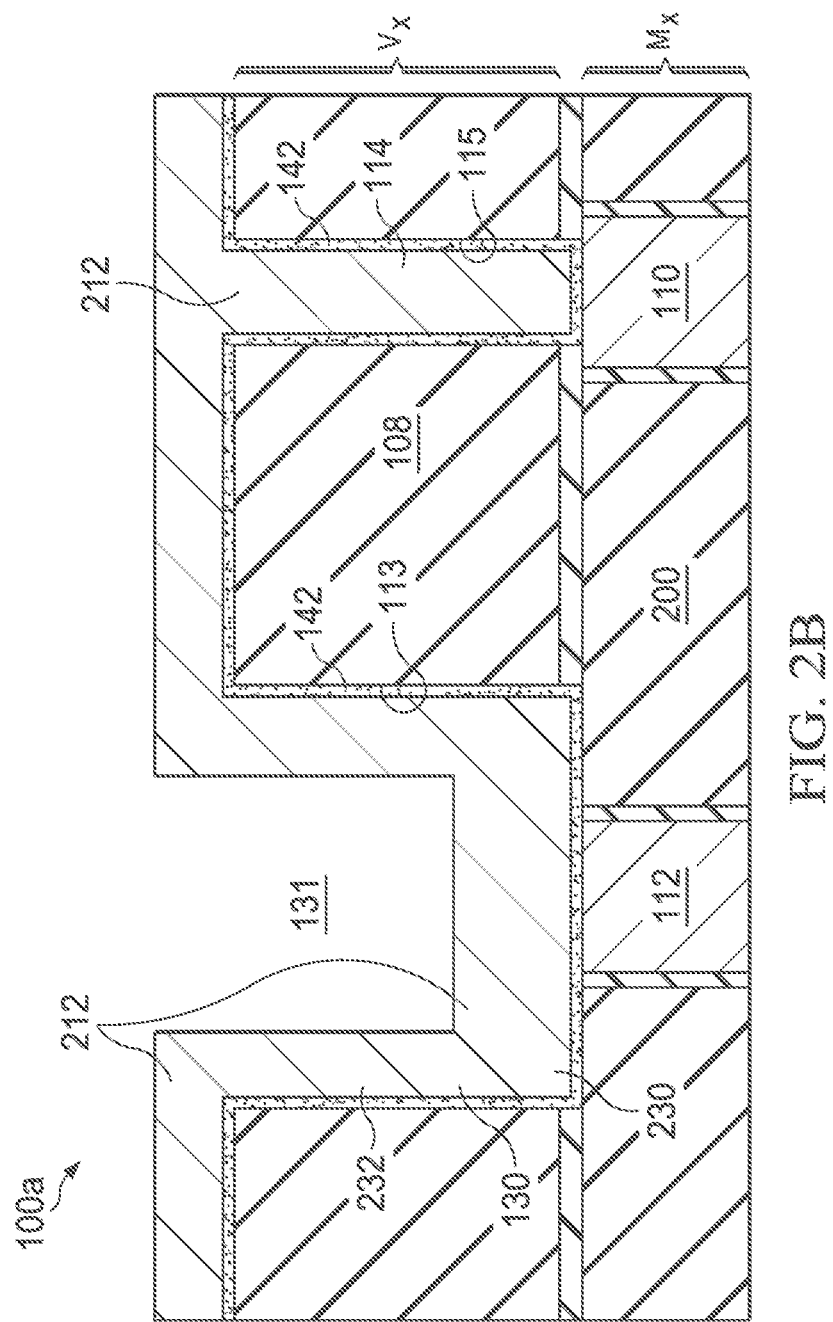
Figure 3:
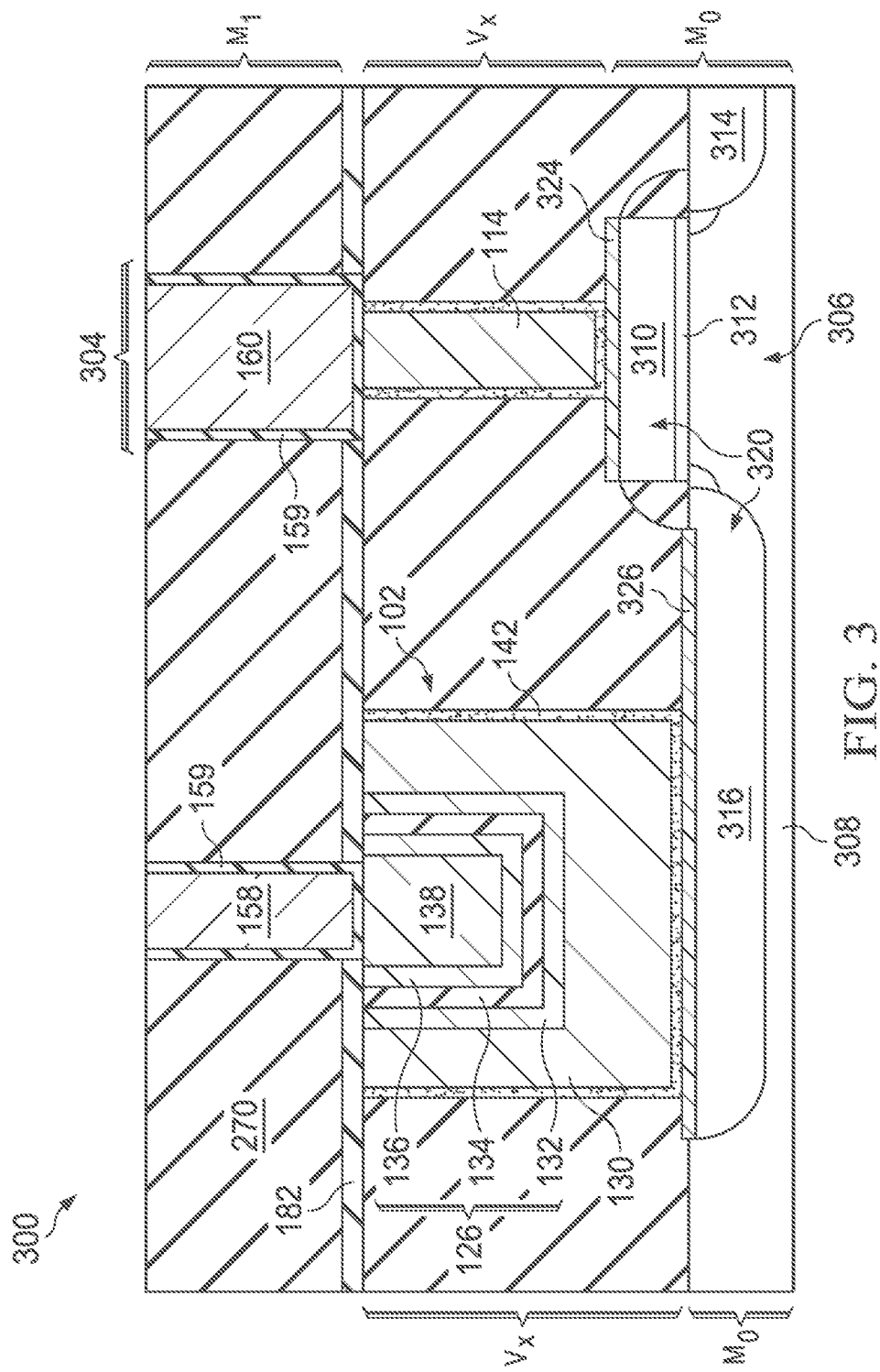
FIG. 3 shows an example integrated circuit structure including the example FRAM capacitor of FIG. 1A or 1B, formed between a silicided active region including a MOSFET transistor and a first metal interconnect layer.

Next, as shown in FIG. 2B, photoresist layer 202 is removed, and a glue layer 142, e.g., comprising TiN, is deposited over the IMD region 108 and extends down into the tub opening 113 and into via opening 115. The glue layer 142 may be deposited using a reactive physical vapor deposition (PVD) process or a chemical vapor deposition (CVD) process. In some examples, the glue layer 142 may have a thickness in the range of 50-500 Å.

A conformal metal layer 212 is then deposited over the glue layer 142 and extends down into the tub opening 113 and into the via opening 115. As shown, the deposited conformal metal layer 212 (a) fills interconnect via opening 115 to form the interconnect via 114 and (b) covers the interior surfaces of the tub opening 113 to form the cup-shaped bottom electrode contact 130 defining interior opening 131. As discussed above, the cup-shaped bottom electrode contact 130 includes a laterally-extending bottom electrode contact cup base 230 and multiple (in this example, four) vertically-extending bottom electrode contact sidewalls 232 extending upwardly from the perimeter of the laterally-extending bottom electrode contact cup base 230. In some examples, the conformal metal layer 212 comprises tungsten, cobalt, aluminum, or other conformal metal deposited with a thickness of 1000 Å to 5000 Å. The conformal metal layer 212 may be deposited by a conformal chemical vapor deposition (CVD) process or other suitable deposition process. The glue layer 142 (e.g., comprising TiN) may increase or enhance an adhesion of the conformal metal layer 212 to the interior surfaces of the tub opening 113, including vertical sidewall surfaces of tub opening 113, to facilitate the formation of the cup-shaped bottom electrode contact 130.

Figure 2C:
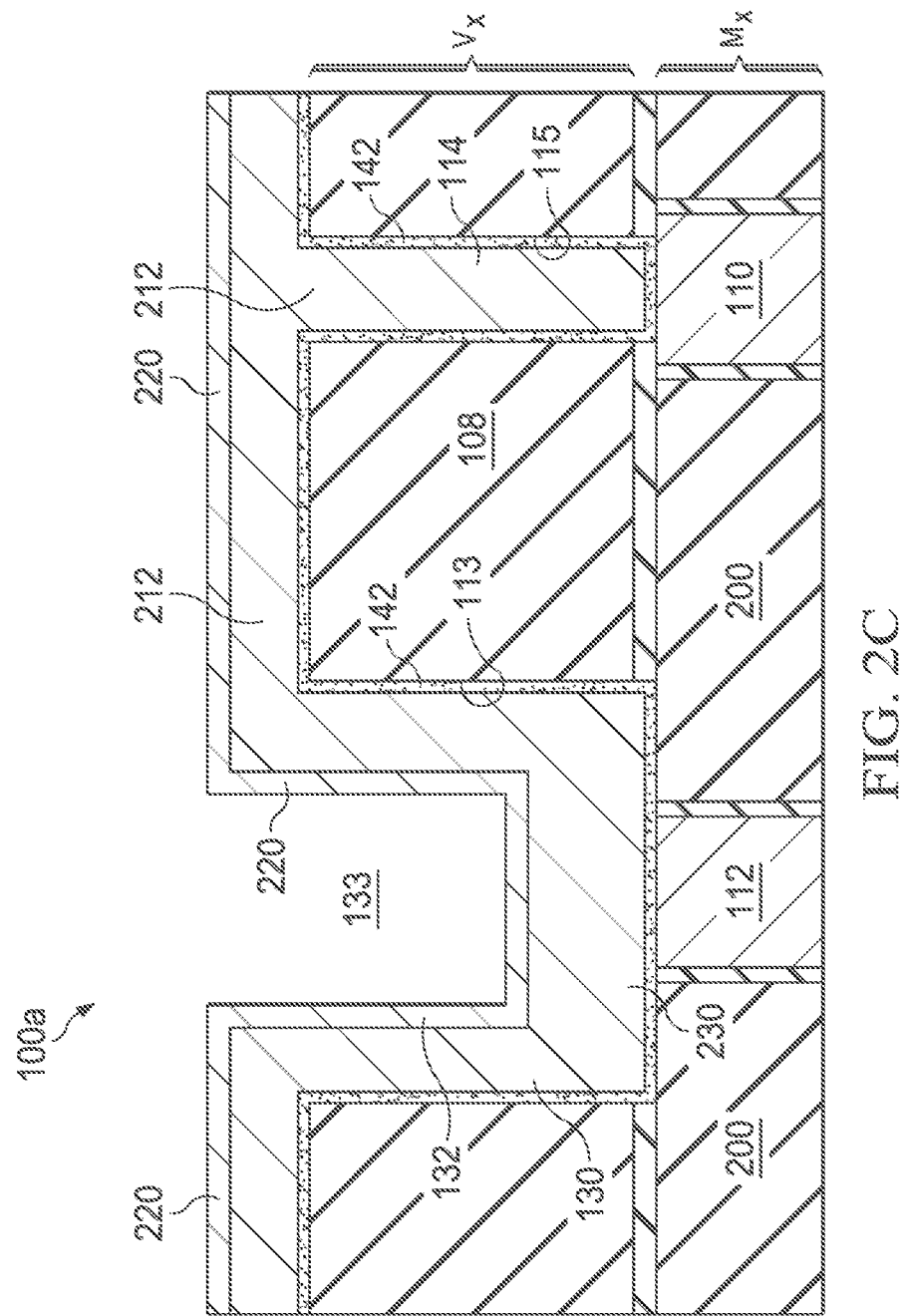

Next, as shown in FIG. 2C, a bottom electrode layer 220 is deposited over the conformal metal layer 212 and extends down into the tub opening 113 to define the cup-shaped bottom electrode 132 formed in the interior opening 131 of the cup-shaped bottom electrode contact 130. The cup-shaped bottom electrode 132 defines interior opening 133. Like the cup-shaped bottom electrode contact 130, the cup-shaped bottom electrode 132 includes a laterally-extending bottom electrode cup base and a plurality of vertically-extending bottom electrode sidewalls (in this example, four sidewalls) extending upwardly from the perimeter of the laterally-extending bottom electrode cup base.

In some examples, the bottom electrode layer 220 may comprise a noble metal, for example, iridium (Ir) or platinum (Pt). For example, the bottom electrode may include iridium oxide (IrO) and iridium (Ir), deposited by a PVD process to form a layer thickness in the range of 500-1000 Å, or in the range of 600-800 Å, or about 700 Å.

Figure 2D:
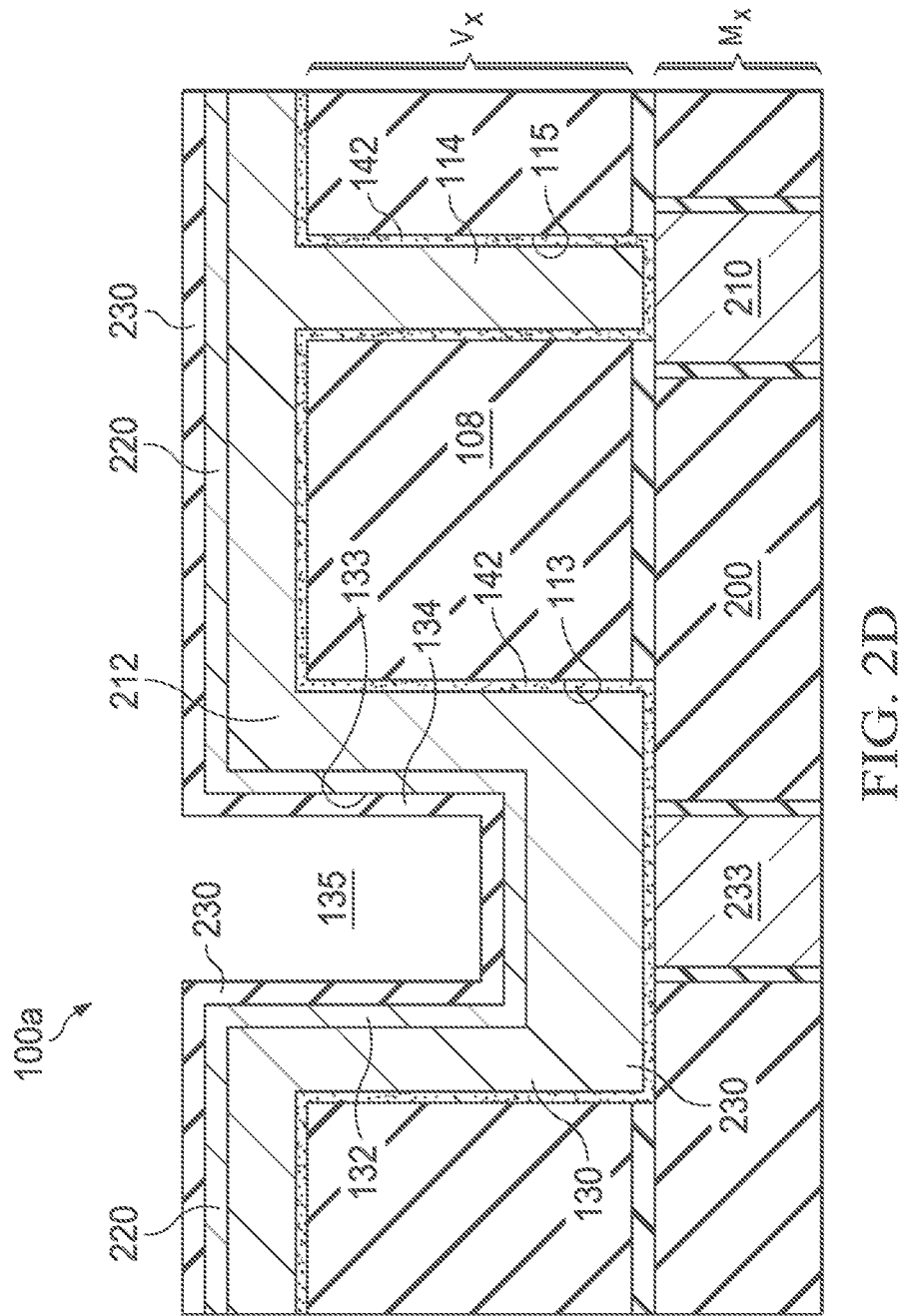

Next, as shown in FIG. 2D, a ferroelectric layer 230 is deposited or formed over the bottom electrode layer 220 and extends down into the interior opening 133 defined by the cup-shaped bottom electrode 132 to define the cup-shaped ferroelectric element 134 having interior opening 135. In some examples, the ferroelectric layer 230 may be deposited using metal-organic chemical vapor deposition (MOCVD). For example, the ferroelectric layer 230 may comprise PZT (lead zirconate titanate, $PbZr_xTi_{1-x}O3$) deposited with a thickness in the range of 500-1000 Å. In another example, the ferroelectric layer 230 may comprise (a) strontium bismuth niobate tantalate, $SrBi_2Nb_2O_9$ (SBNT), (b) strontium-bismuth-tantalate, $Sr_{1-y}Bi_{2+x}Ta_2O_9$ (SBT), (c) lanthanum-substituted bismuth-titanate, $Bi_{4-x}La_xTi_3O_{12}$ (BLT), or any other suitable ferroelectric material.

Figure 2E:
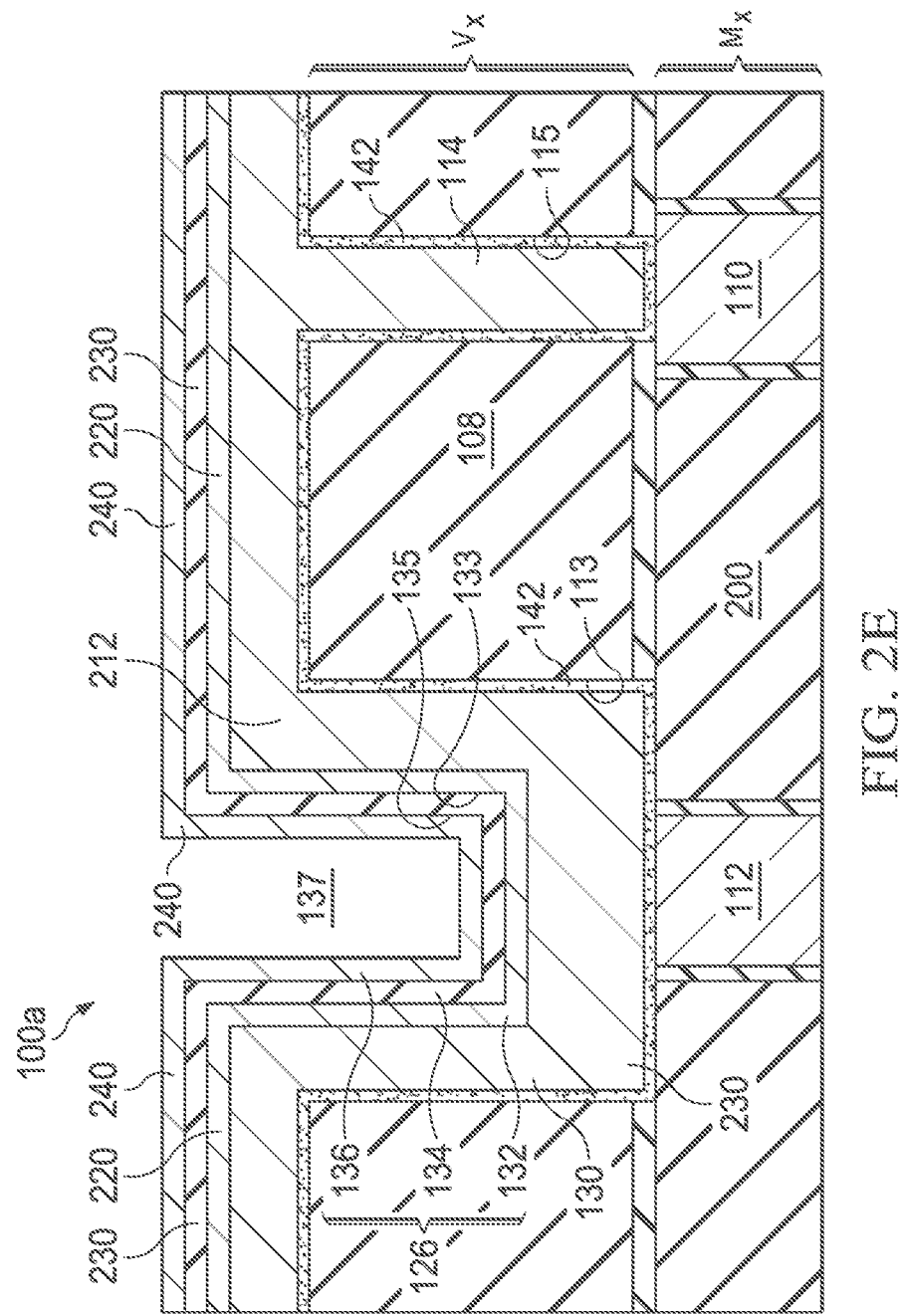

Next, as shown in FIG. 2E, a top electrode layer 240 may be deposited over the ferroelectric layer 230 and extending down into the interior opening 135 defined by the cup-shaped ferroelectric element 134, to define the top electrode 136 having interior opening 137. In one example, top electrode 136 is cup-shaped. The top electrode layer 240 may comprise a noble metal, for example, iridium (Ir) or platinum (Pt). For example, the top electrode layer 240 may include iridium oxide (IrO) and iridium (Ir), deposited by a PVD process to form a layer thickness in the range of 400-800 Å, or in the range of 500-700 Å, or about 600 Å.

Figure 2F:
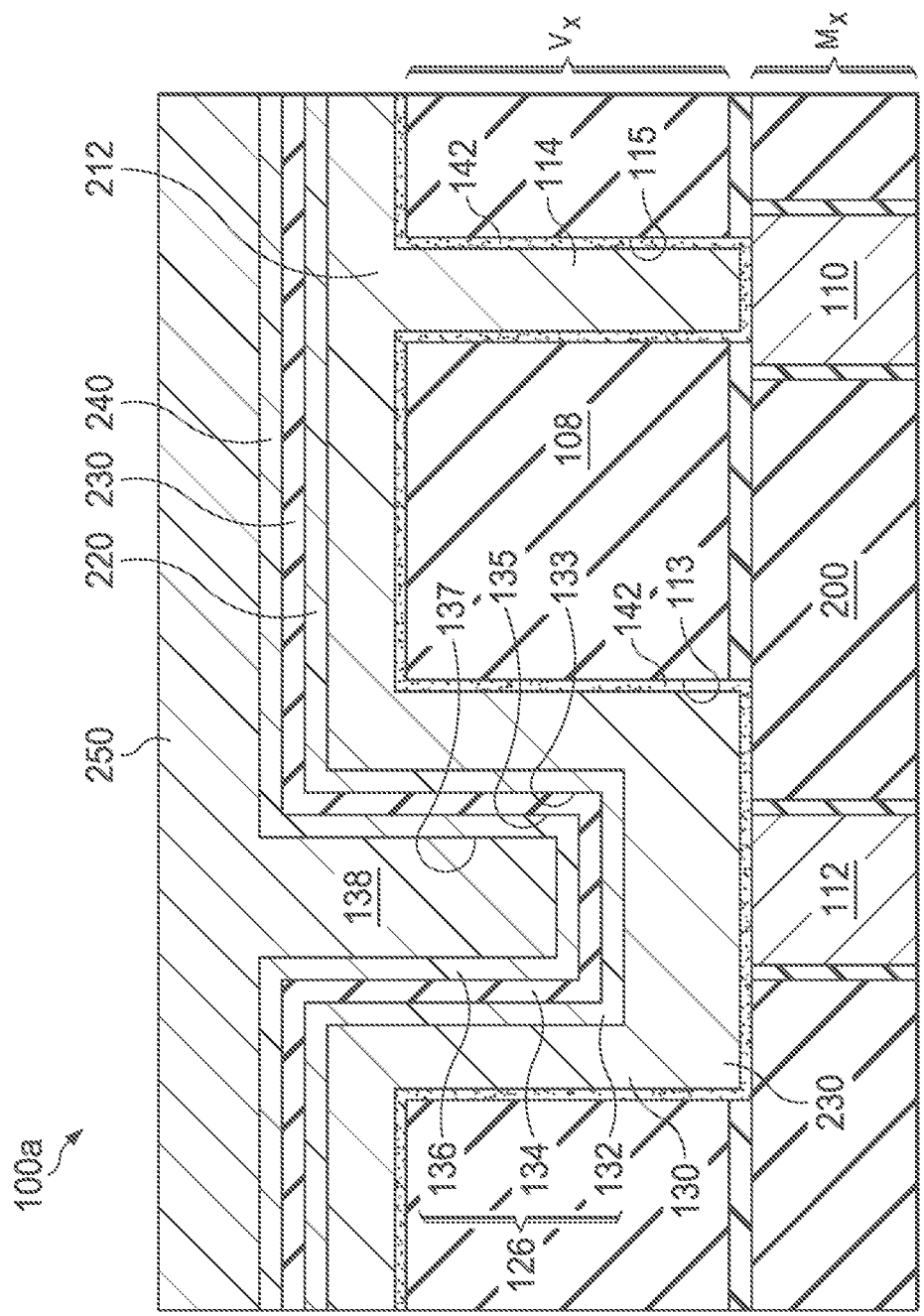

Next, as shown in FIG. 2F, a top electrode contact layer 250 may be deposited to form the top electrode contact 138 in the interior volume 137 defined by the top electrode 136, e.g. cup-shaped top electrode 136. In some examples, the top electrode contact layer 250 may comprise titanium nitride (TiN), tungsten (W), or a combination of thereof. Titanium nitride (TiN) may be deposited by a reactive physical vapor deposition (PVD) process or a chemical vapor deposition (CVD) process, for example. Tungsten (W) may be deposited using a CVD process, for example. In other examples, the top electrode contact layer 250 may comprise aluminum (Al), titanium (Ti), titanium tungsten (TiW), cobalt (Co), tantalum (Ta), tantalum nitride (TaN), copper (Cu), or any combination thereof.

Figure 2G:
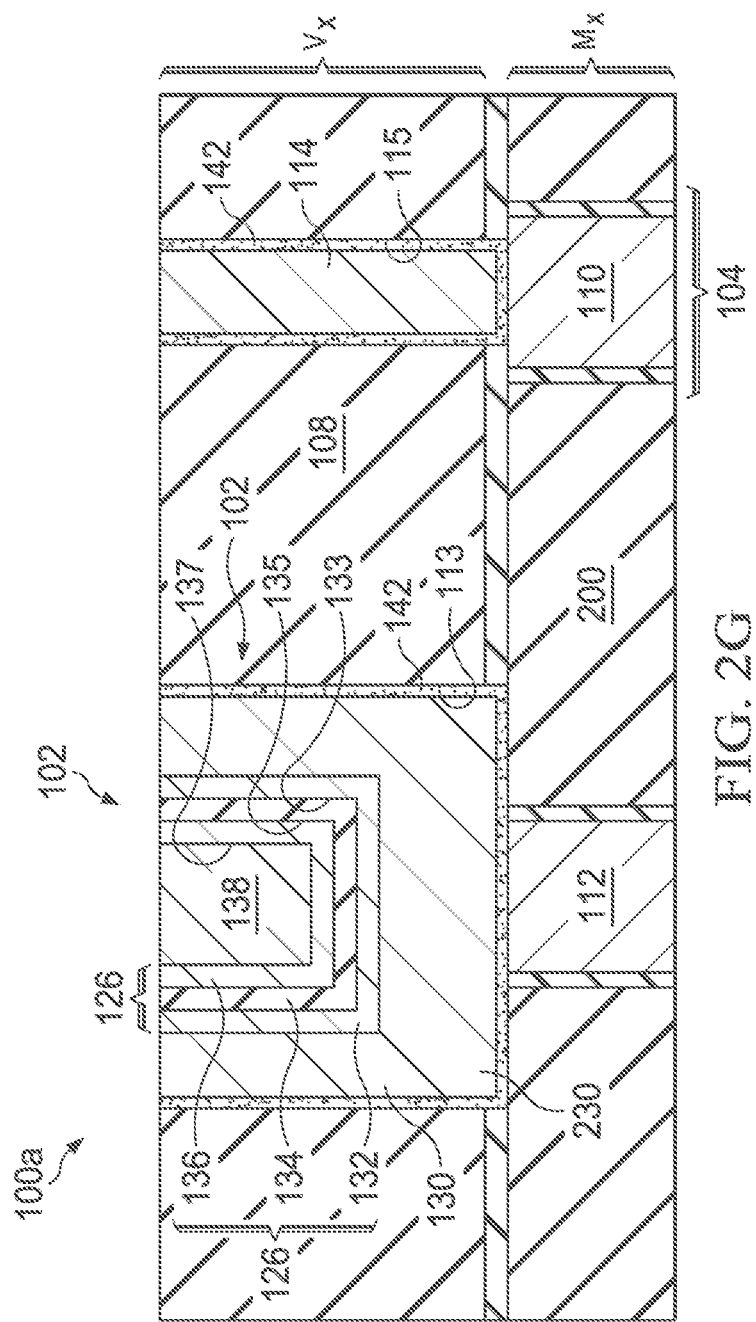

Next, as shown in FIG. 2G, a chemical mechanical planarization (CMP) process may be performed to remove portions of the previously deposited layers that extend outside the tub opening 113 or via opening 115, including portions of glue layer 142, conformal metal layer 212, bottom electrode layer 220, ferroelectric film 230, top electrode layer 240, and top electrode contact layer 250 outside the tub opening 113 or via opening 115. As shown in FIG. 2G, the CMP process effectively planarizes the top surfaces of the cup-shaped bottom electrode contact 130, cup-shaped bottom electrode 132, cup-shaped ferroelectric element 134, top electrode 136, top electrode contact 138 and via 114 with the surrounding IMD region 108. The cup-shaped bottom electrode 132, cup-shaped ferroelectric element 134, and top electrode 136 collectively define the 3D EFE structure 126.

Forming the FRAM capacitor 102 using such a damascene process—referred to herein as a "damascene integration"—allows the FRAM capacitor 102 to be formed without a metal etch, which may be advantageous as compared with other processes for forming an FRAM capacitor that require one or more metal etch. For example, during a plasma etch of prior art processes, certain exotic materials such as (a) iridium (Ir) (which may be used for the bottom electrode and/or top electrode) and (b) PZT or other example ferroelectric materials forming the ferroelectric element do not form a volatile by-product (i.e., a removable gas by-product) in the plasma etch chamber, resulting in a solid by-product remaining in the etch chamber, which can be problematic due to particle generation and degradation of etch chamber performance (e.g., etch rate, within wafer non-uniformity, and selectivity). The damascene integration disclosed above allows the use of exotic materials such as iridium and PZT (or other disclosed ferroelectric materials) in the FRAM capacitor 102 while avoiding the problems associated with etching such materials.

Figure 2H:
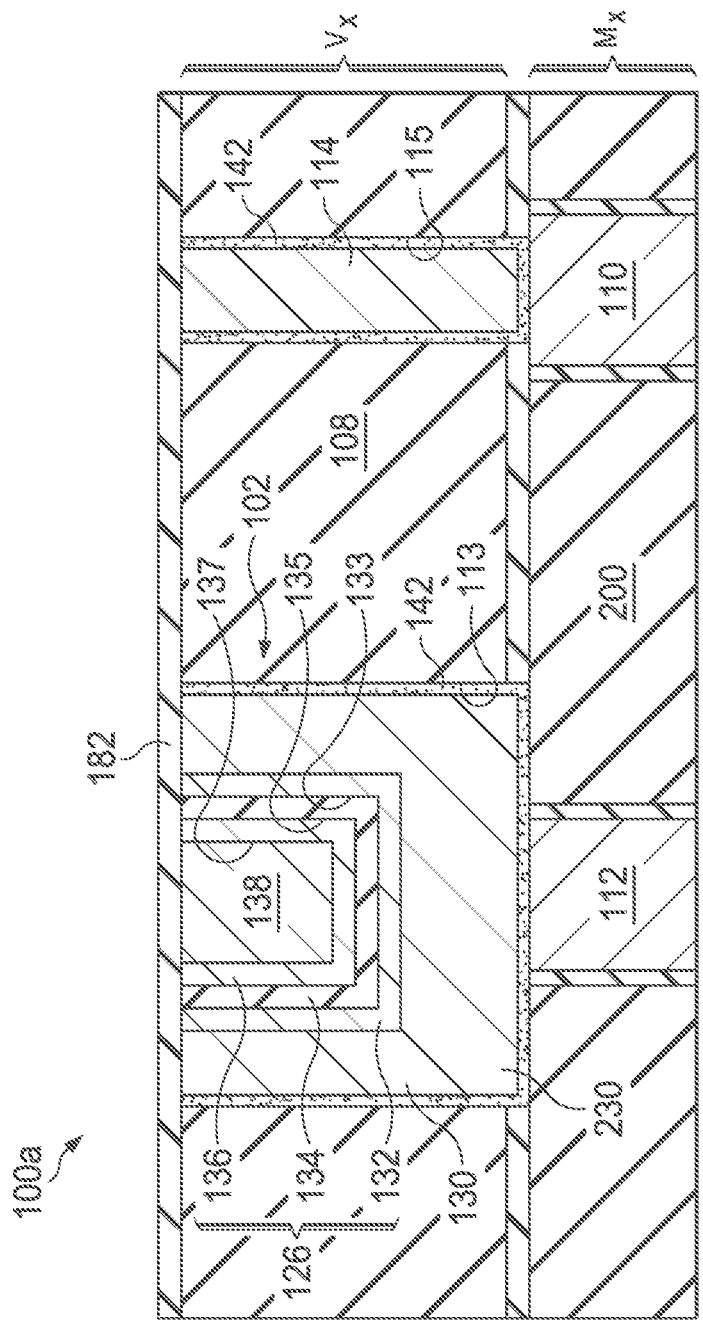

Next, as shown in FIG. 2H, diffusion barrier layer 182 may be deposited on the integrated circuit structure 100a. The diffusion barrier layer 182 may act as a hydrogen diffusion barrier to protect the cup-shaped ferroelectric element 134 against degradation from hydrogen exposure. Thus, the diffusion barrier layer 182 may fully cover the exposed top surfaces of the cup-shaped ferroelectric element 134. In some examples, the diffusion barrier layer 182 may comprise a dielectric material such as silicon nitride (SiN) or silicon carbide (SiC) with a thickness in the range of 300-1000 Å, for example in the range of 400-600 Å. In some embodiments, the diffusion barrier layer 182 may be deposited by plasma enhanced chemical vapor deposition (PECVD), high density plasma (HDP), or low pressure chemical vapor deposition (LPCVD).

In addition, in some examples the diffusion barrier layer 182 also acts as an etch stop layer for a damascene trench etch (e.g., Cu trench etch) during formation of overlying metal structures, as discussed below.

Figure 2I:
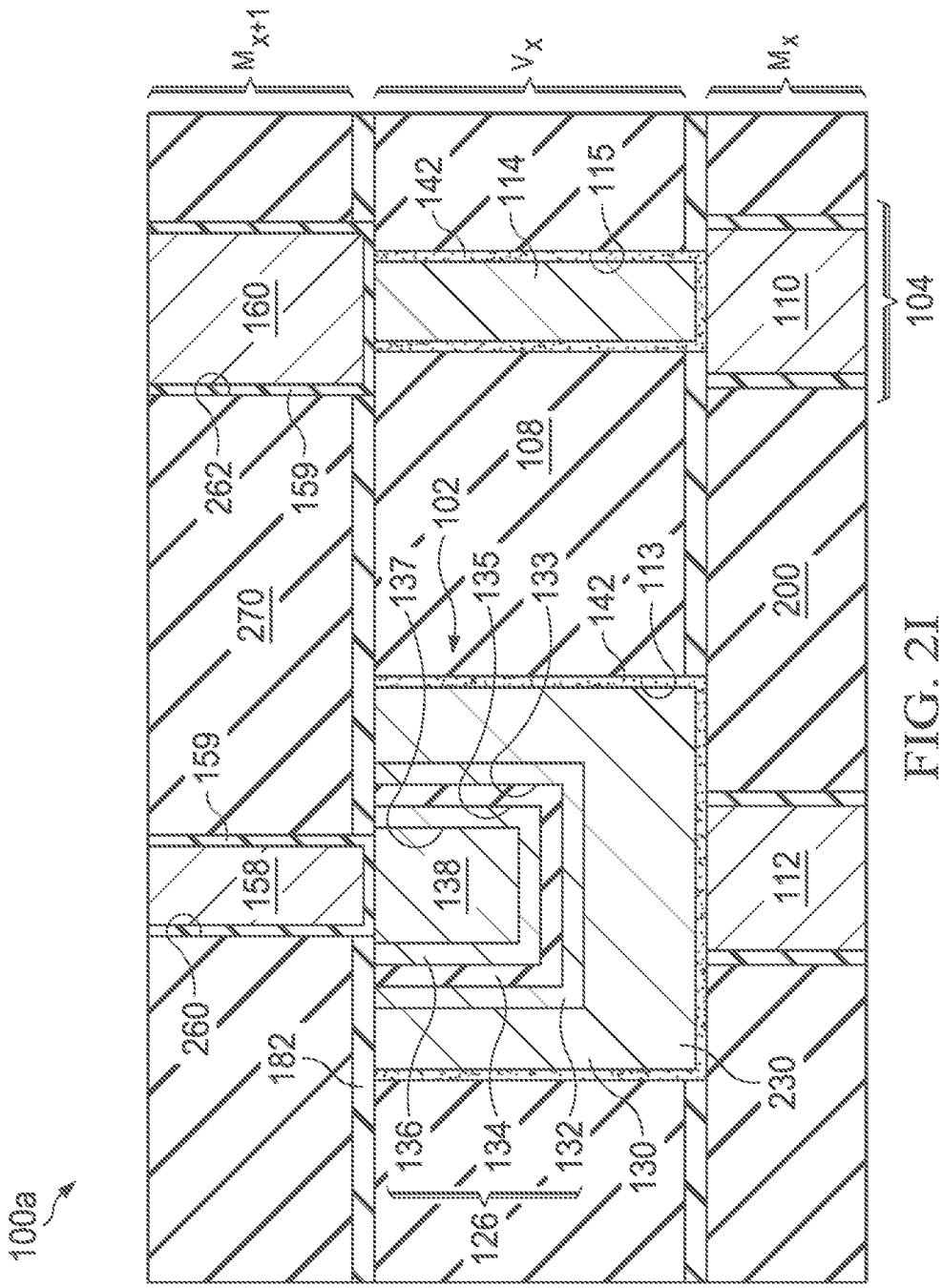

Next, as shown in FIG. 2I, the upper metal layer $M_{x+1}$, including the capacitor contact 158 and upper interconnect element 160, is formed above the via layer Vx including via 114 and FRAM capacitor 102, e.g., by a damascene process. In one example, upper metal layer $M_{x+1}$ comprises a copper interconnect layer formed by a copper damascene process.

To form the upper metal layer $M_{x+1}$, a dielectric layer 270 is first deposited over the diffusion barrier layer 182. In some examples, the dielectric layer 270 may comprise silicon oxide, FSG (FluoroSilicate Glass), OSG (OrganoSilicate Glass), or porous OSG. The dielectric layer 270 may be patterned and etched to form a capacitor contact opening 260 above the top electrode contact 138, and an interconnect opening 262 (e.g., trench opening) above the via 114, with the etch proceeding through diffusion barrier layer 182 through the capacitor contact opening 260 and interconnect opening 262. A barrier layer (e.g., a TaN/Ta bilayer) indicated at 159 and a copper seed layer may be deposited over the dielectric layer 270 and extending down into the etched capacitor contact opening 260 and interconnect opening 262. A copper plating process may then be performed, which fills the capacitor contact opening 260 and interconnect opening 262 with copper. A copper anneal may be performed, followed by a copper CMP process to remove portions of the copper above the capacitor contact opening 260 and interconnect opening 262, thereby defining the capacitor contact 158 in electrical contact with the top electrode contact 138 of the FRAM capacitor 102, and an upper interconnect element 160 in electrical contact with the via 114. In other examples, others metal (other than copper) may be used to form the capacitor contact 158 and upper interconnect element 160, for example, tungsten (W), cobalt (Co), or aluminum (Al).

After forming the upper metal layer $M_{x+1}$ as discussed above, the process may continue to construct additional interconnect structures, e.g., by constructing additional metal layers separated by respective dielectric layers.

Figure 4A:
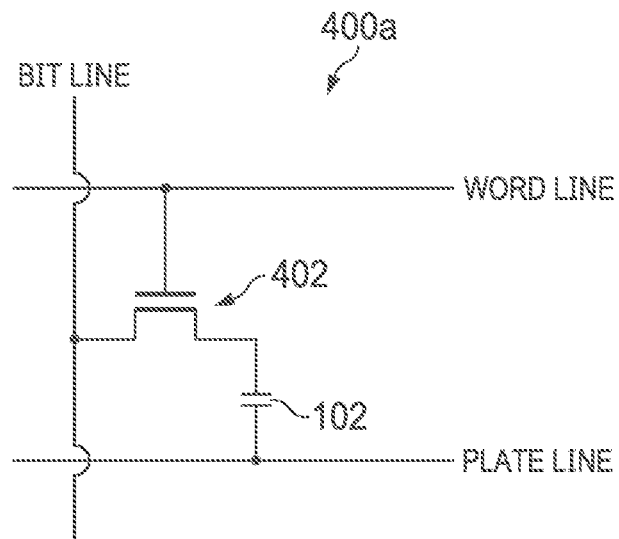
FIG. 4A shows an example FRAM memory cell having a 1T1C architecture including one transistor (e.g., MOSFET) and one FRAM capacitor as disclosed herein.
Figure 4B:
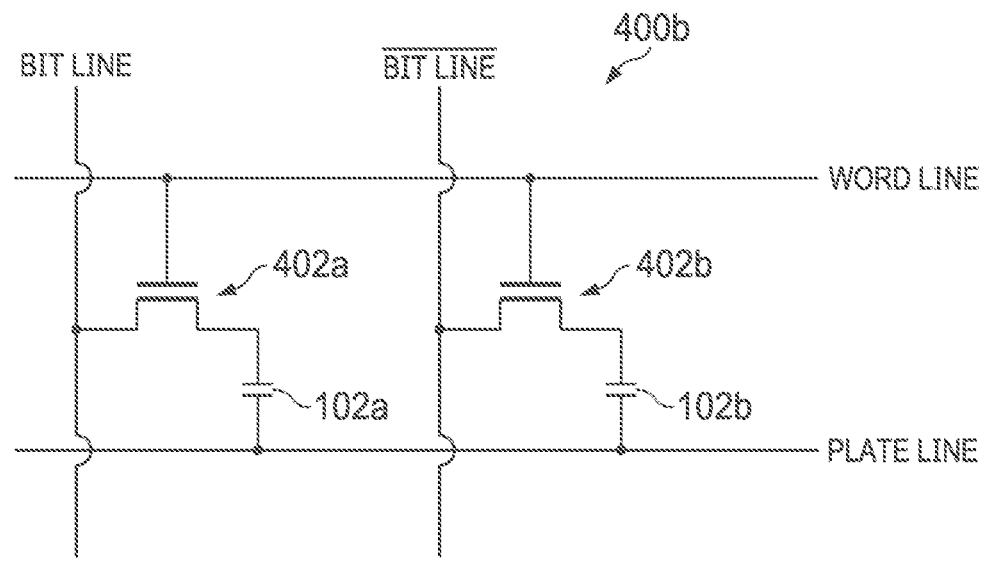
FIG. 4B shows an example FRAM memory cell having a 2T2C architecture including two transistors (e.g., MOSFETs) and two FRAM capacitors as disclosed herein.

FIG. 3 shows an example integrated circuit structure 300 including the example FRAM capacitor 102 formed on a metal-oxide-semiconductor field-effect transistor (MOSFET) 306, along with an interconnect structure 304. FRAM capacitor 102 and MOSFET 306 may be components of an FRAM memory cell, for example a 1T1C FRAM memory cell as shown in FIG. 4A (discussed below) or a 2T2C FRAM memory cell as shown in FIG. 4B (discussed below).

Unlike the example shown in FIGS. 1A and 1B in which the FRAM capacitor 102 is formed between two adjacent metal interconnect layers $M_x$ and $M_{x+1}$, in the example shown in FIG. 3 the FRAM capacitor 102 is formed between (a) a silicided active region $M_0$ (i.e., $M_x$ where x=0) including silicided structures 320 (e.g., silicided transistor components) and (b) a first metal interconnect layer $M_1$ (i.e., $M_{x+1}$ where x=0), often referred to as Metal-1.

As shown in FIG. 3, the silicided active region $M_0$ includes the MOSFET 306 formed on a silicon substrate 308. The MOSFET 306 may include a polysilicon gate 310 formed over and separated from the silicon substrate 308 by gate oxide layer 312, and a doped source region 314 and a doped drain region 316 formed in the silicon substrate 308. In this example, the polysilicon gate 310 and the doped drain region 316 comprise silicided structures 320. In particular, a metal silicide layer 324 is formed on a top surface of the polysilicon gate 310, and a metal silicide layer 326 is formed on a top surface of doped drain region 316. Metal silicide layers 324 and 326 may comprise any suitable metal silicide layer, for example titanium silicide (TiSi2), cobalt silicide (CoSi2), or nickel silicide (NiSi), having a thickness in the range of 100-300 Å or other suitable thickness. For the purposes of the present disclosure, metal silicide layers 324 and 326 define metal structures, such that the silicided active region $M_0$ can be considered as a metal layer.

In the example shown in FIG. 3, the FRAM capacitor 102 is formed on the metal silicide layer 326 on top of the doped drain region 316 to provide a conductive connection between the FRAM capacitor 102 and the doped drain region 316. The FRAM capacitor 102 is contacted from above by the capacitor contact 158, as discussed above. Further, the via 114 (also commonly referred to as a contact) is formed on the metal silicide layer 324 on top of the polysilicon gate 310 to provide a conductive connection between the polysilicon gate 310 and the upper interconnect element 160. While the FRAM capacitor 102 is shown between doped drain region 316 and capacitor contact 158, the FRAM capacitor 102 may similarly be formed between the doped source region 314 and capacitor contact 158, or between the polysilicon gate 310 and capacitor contact 158. The capacitor contact 158 and upper interconnect element 160 comprise metal elements formed in the first metal interconnect layer $M_1$, e.g., by a damascene process.

FIG. 4A shows an example FRAM memory cell 400a having a 1T1C architecture including one transistor (e.g., MOSFET) 402 and one FRAM capacitor 102 (e.g., constructed as described herein). The gate of transistor 402 is connect to a word line, one end of FRAM capacitor 102 is connected to a plate line, a second end of FRAM capacitor 102 is connected to a first terminal of transistor 402 and a second terminal of transistor 402 is connected to a bit line.

FIG. 4B shows an example FRAM memory cell 400b having a 2T2C architecture including two transistors (e.g., MOSFETs) 402a and 402b and two FRAM capacitors 102a and 102b connected to a pair of bit lines, a word line, and a plate line as described above in relation to example FRAM memory cell 400a, with each of the transistors 402a and 402b being supplied with a respective bit line. Each FRAM capacitor 102a and 102b may correspond with the example FRAM capacitor 102 constructed as described above herein.

The invention claimed is:

1. A method of forming an integrated circuit structure including a ferroelectric random access memory capacitor, the method comprising:
   forming a tub opening and a via opening in a dielectric region, wherein the via opening is laterally spaced apart from the tub opening;
   concurrently forming a cup-shaped bottom electrode contact in the tub opening and a via in the via opening;
   forming a cup-shaped bottom electrode in an interior opening defined by the cup-shaped bottom electrode contact;
   forming a cup-shaped ferroelectric element in an interior opening defined by the cup-shaped bottom electrode;
   forming a top electrode in an interior opening defined by the cup-shaped ferroelectric layer; and
   forming an upper metal layer over the dielectric region, the upper metal layer including a capacitor contact in conductive contact with the top electrode;
   wherein the cup-shaped bottom electrode, cup-shaped ferroelectric element, and top electrode define the ferroelectric random access memory capacitor.

2. The method of claim 1, wherein the ferroelectric random access memory capacitor is formed by a damascene process.

3. The method of claim 1, wherein the ferroelectric random access memory capacitor is formed without adding any photomask processes to a background integrated circuit fabrication process.

4. The method of claim 1, wherein concurrently forming the cup-shaped bottom electrode contact in the tub opening and the via in the via opening comprises depositing a conformal metal to concurrently form the cup-shaped bottom electrode contact in the tub opening and the via in the via opening.

5. The method of claim 4, wherein forming the upper metal layer over the dielectric region comprises concurrently forming the capacitor contact in contact with the top electrode and an upper interconnect element in contact with the via.

6. The method of claim 1, comprising, prior to forming the upper metal layer over the dielectric region:
   planarizing a top surface of the cup-shaped ferroelectric element with a top surface of the dielectric region; and
   depositing a diffusion barrier layer to cover the planarized top surface of the cup- shaped ferroelectric element.

7. The method of claim 1, comprising, prior to forming the upper metal layer over the dielectric region:
   planarizing a top surface of the cup-shaped bottom electrode, a top surface of the cup-shaped ferroelectric element, and a top surface of the top electrode; and
   depositing a diffusion barrier layer to cover the planarized top surfaces of the cup-shaped bottom electrode, the cup-shaped ferroelectric element, and the top electrode.

8. The method of claim 1, wherein
   the top electrode is cup-shaped;
   the method comprises forming a top electrode contact in an interior volume defined by the cup-shaped top electrode; and
   the capacitor contact is formed in conductive contact with the top electrode contact such that the capacitor contact is in conductive contact with the top electrode.

9. The method of claim 1, wherein each of the bottom electrode and the top electrode comprises at least one noble metal.

10. The method of claim 1, wherein each of the bottom electrode and the top electrode comprises iridium or platinum.

11. The method of claim 1, wherein each of the bottom electrode and the top electrode comprises iridium and iridium oxide.

12. The method of claim 1, wherein the ferroelectric element comprises lead zirconate titanate (PZT).

13. The method of claim 1, wherein the ferroelectric element comprises strontium bismuth ni ob ate tantal ate, strontium-bismuth-tantal ate, or lanthanum-substituted bi smuth-titanate.

14. A method of forming an integrated circuit structure including a ferroelectric random access memory capacitor, the method comprising:
   forming a tub opening in a dielectric region;
   forming a cup-shaped bottom electrode in the tub opening;
   forming a cup-shaped ferroelectric element in an interior opening defined by the cup-shaped bottom electrode;
   forming a cup-shaped top electrode in an interior opening defined by the cup-shaped ferroelectric layer; and
   forming a conductive top electrode contact at least partially formed in an interior opening defined by the cup-shaped top electrode; and
   forming an upper metal layer over the dielectric region, the upper metal layer including a capacitor contact connected to the conductive top electrode contact, thereby defining a conductive contact between the capacitor contact and the top electrode through the conductive top electrode contact;
   wherein the cup-shaped bottom electrode, cup-shaped ferroelectric element, and top electrode define the ferroelectric random access memory capacitor.

15. The method of claim 14, comprising performing a planarization process forming a planarized surface defining a top surface of the conductive cup-shaped bottom electrode contact, a top surface of the cup-shaped bottom electrode, a top surface of the cup-shaped ferroelectric element, a top surface of the cup-shaped top electrode, and a top surface of the conductive top electrode contact.

16. The method of claim 14, comrpsing:
forming an upper dielectric layer;
forming a capacitor contact opening in the upper dielectric layer, the capacitor contact opening exposing an upper surface of the capacitor contact but not exposing an upper surface of the top electrode; and
forming the capacitor contact in the capacitor contact opening.

17. The method of claim 16, wherien forming the capacitor contact in the capacitor contact opening comprises:
depositing a barrier layer extending into the capacitor contact opening; and
depositing a metal over the barrier layer in the capacitor contact opening.

18. The method of claim 14, wherein the upper metal layer formed over the dielectric region further includes an interconnect element spaced apart from the capacitor contact.

19. A method of forming an integrated circuit structure including a ferroelectric random access memory capacitor, the method comprising:

depositing a metal to concurrently form a bottom electrode contact and a via spaced apart from the bottom electrode contact;

forming a cup-shaped bottom electrode over the cup-shaped bottom electrode contact;

forming a cup-shaped ferroelectric element in an interior opening defined by the cup-shaped bottom electrode;

forming a top electrode in an interior opening defined by the cup-shaped ferroelectric layer; and forming an upper metal layer over the dielectric region, the upper metal layer including a capacitor contact in conductive contact with the top electrode;

wherein the cup-shaped bottom electrode, cup-shaped ferroelectric element, and top electrode define the ferroelectric random access memory capacitor.

20. The method of claim 19, wherien the bottom electrode contact is cup-shaped.

\* \* \* \* \*